(12) United States Patent
Forbes

(10) Patent No.: US 7,759,233 B2
(45) Date of Patent: Jul. 20, 2010

(54) METHODS FOR STRESSING SEMICONDUCTOR MATERIAL STRUCTURES TO IMPROVE ELECTRON AND/OR HOLE MOBILITY OF TRANSISTOR CHANNELS FABRICATED THEREFROM, AND SEMICONDUCTOR DEVICES INCLUDING SUCH STRUCTURES

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 209 days.

(21) Appl. No.: 11/726,998

(22) Filed: Mar. 23, 2007

(65) Prior Publication Data

US 2008/0233725 A1 Sep. 25, 2008

(51) Int. Cl.
*H01L 21/3205* (2006.01)
(52) U.S. Cl. ........................ 438/585; 438/584
(58) Field of Classification Search .............. 257/18, 257/57, 59; 438/584, 585
See application file for complete search history.

(56) References Cited

U.S. PATENT DOCUMENTS

| | | | |
|---|---|---|---|
| 6,255,698 B1 | 7/2001 | Gardner et al. | |
| 6,603,156 B2 | 8/2003 | Rim | |
| 6,653,656 B2* | 11/2003 | Iwamatsu et al. | 257/59 |
| 6,767,802 B1 | 7/2004 | Maa et al. | |
| 6,828,214 B2 | 12/2004 | Notsu et al. | |
| 6,881,650 B2 | 4/2005 | Lee et al. | |
| 6,900,521 B2 | 5/2005 | Forbes et al. | |
| 6,911,379 B2 | 6/2005 | Yeo et al. | |
| 6,940,089 B2 | 9/2005 | Cheng et al. | |
| 6,963,078 B2 | 11/2005 | Chu | |
| 6,967,121 B2 | 11/2005 | Rhodes | |
| 7,008,854 B2 | 3/2006 | Forbes | |
| 7,015,505 B2* | 3/2006 | Yamazaki et al. | 257/57 |
| 7,115,480 B2* | 10/2006 | Forbes | 438/457 |
| 7,198,974 B2* | 4/2007 | Forbes | 438/50 |
| 2004/0173798 A1 | 9/2004 | Forbes | |
| 2004/0217352 A1 | 11/2004 | Forbes | |
| 2004/0217391 A1 | 11/2004 | Forbes | |
| 2004/0224480 A1 | 11/2004 | Forbes | |
| 2004/0232487 A1 | 11/2004 | Forbes | |

(Continued)

OTHER PUBLICATIONS

U.S. Appl. No. 11/498,586, filed Aug. 2006, Forbes.

(Continued)

*Primary Examiner*—Thanh V Pham
*Assistant Examiner*—Marvin Payen
(74) *Attorney, Agent, or Firm*—TraskBritt

(57) ABSTRACT

Semiconductor material strips are secured to substrates in such a way as to stress the semiconductor material. The strips of semiconductor material may be compressively stressed, subjected to tensile stress, or some strips may be compressively stressed while other strips are tensilely stressed. Stress may be induced by forming non-planarities on a surface of the substrate to which the strips are to be secured. The non-planarities may be configured to stress strips of semiconductor material as the strips are secured thereover and over an intervening surface of the substrate, or to stress strips as the non-planarities are removed from beneath the strips. The strain that ultimately results from stressing the strips improves carrier mobility (i.e., electron mobility, electron hole pair, or "hole," mobility) relative to the carrier mobilities of unstrained semiconductor materials. The strained strips of semiconductor material may be used in the fabrication of semiconductor device structures such as transistors.

34 Claims, 7 Drawing Sheets

U.S. PATENT DOCUMENTS

| | | | |
|---|---|---|---|
| 2005/0020094 A1 | | 1/2005 | Forbes et al. |
| 2005/0029619 A1 | | 2/2005 | Forbes |
| 2005/0167752 A1 | | 8/2005 | Forbes |
| 2007/0215936 A1* | | 9/2007 | Ko et al. .................... 257/327 |
| 2007/0246702 A1* | | 10/2007 | Andrieu et al. ............... 257/18 |

OTHER PUBLICATIONS

Irie et al., In-Plane mobility Anisotropy and Universality Under Uniaxial Strains in n- and p-MOS Inversion Layers on (100), (110), and (111) Si, Tokyo, Japan, IEDM Tech. Dig, pp. 225-228, Dec. 2004.

Yuan et al., Fabrication and Transistor Demonstration on Si-based nanomembranes, Madison, Wisconsin, NSTI-Nanotech vol. 1, pp. 68-71, 2006.

Subhanna et al., High-Performance Silicon-Germanium Technology, Hopewell Junction, New York, IEEE, pp. 195-196, 2005.

Chleirigh et al.,Mobility and Sub-threshold Characteristics in High-Mobility Dual-Channel Strained Si/Strained SiGe p-MOSFETs, Cambridge, MA, IEEE, pp. 203-204, 2005.

Kawasaki et al., Impact of Parasitic Resistance and Silicon Layer Thickness Scaling for Strained-Silicon MOSFETs on RElaxed Sil-xGeI Virtual Substrate,Yokohama, Tokyo, IEEE, 4 pages, 2004.

Cai et al., Performance Comparison and Channel Length Scaling of Strained Si FETs on SiGe-on-Insulator (SGOI), Hopewell Junction, New York, IEEE , 4 pages, 2004.

Aberg et al., High Electron and Hole Mobility Enhancements in Thin-Body Strained Si/Strained SiGe/Strained Si Heterostructures on Insulator, Cambridge, MA, IEEE , 4 pages, 2004.

Numata et al., Performance Enhancement of Partially- and Fully-Depleted Strained-SOI MOSFETs and Characterization of Strained-Si Device Parameters, Kawasaki, Japan, IEEE, 4 pages, 2004.

Thompson et al., Key Differences for Process-induced Uniaxial vs. Substrate-induced Biaxial Stressed Si and Ge Channel MOSFETs, Gainesville, Florida, IEEE, 4 pages, 2004.

Uchida et al., Experimental Study of Biaxial and Uniaxial Strain Effects on Carrier Mobility in Bulk and Ultrathin-body SOI MOSFETs, Stanford University, CA, IEEE, 4 pages, 2004.

Maikap et al., Package-Strain-Enhanced Device and Circuit Performance, Chung-Li, Taiwan, IEEE 4 pages, 2004.

Ghani et al., A 90nm High Volume Manufacturing Logic Technology Featuring Novel 45nm Gate Length Strained Silicon CMOS Transistors, Hillsboro, OR, IEDM, vol. 3, pp. 978-980, 2003.

Ang et al., Enhanced Performance in 50nm N-MOSFETs with Silicon-Carbon Source/Drain Regions, National University of Singapore, Singapore, IEEE, 3 pages, 2004.

Goto et al., Technology Booster Using Strained-Enhancing Laminated SiN (SELS) for 65nm HP MPUs, Tokyo, Japan, IEEE, 4 pages, 2004.

Pidin et al., A Novel Strain Enhanced CMOS Architecture Using Selectively Deposited High Tensile and High Compressive Silicon Nitride Films, Tokyo, Japan, IEEE, 4 pages, 2004.

Lomoda et al., Mobility Improvement for 45nm Node by Combination of Optimized Stress Control and Channel Orientation Design, Yokohama, Japan, IEEE, 4 pages, 2004.

Yin et al., Fully-Depleted Strained-Si on Insulator NMOSFETs without Relaxed SiGe Buffers, Princeton, NJ, IEDM, vol. 3, pp. 53-56, 2003.

Cheng et al., Fully Depleted Strained-SOI n- and p-MOSFETs on Bonded SGOI Substrates and Study of the SIGE/BOX Interface, IEEE Electron Device letters, vol. 25, No. 3, Mar. 2003, pp. 14-149.

Aberg et al., Electron and Hole Mobility Enhancements in Sub-10nm-thick Strained Silicon Directly on Insulator Fabricated by a Bond and Etch-back Technique, Cambridge, MA, Symposium on VLSI Technology Digest of Technical Papers, pp. 52-53, 2004.

* cited by examiner

METHODS FOR STRESSING SEMICONDUCTOR MATERIAL STRUCTURES TO IMPROVE ELECTRON AND/OR HOLE MOBILITY OF TRANSISTOR CHANNELS FABRICATED THEREFROM, AND SEMICONDUCTOR DEVICES INCLUDING SUCH STRUCTURES

FIELD OF THE INVENTION

Embodiments of the present invention relate generally to methods for fabricating strained active-device regions of semiconductor device structures. More specifically, embodiments of the present invention relate to methods in which strips of semiconductor material are applied to a semiconductor substrate in such a way as to stress the semiconductor material of the strips. Embodiments of the present invention also relate to semiconductor device structures with strained active-device regions.

BACKGROUND OF RELATED ART

Improvements in hole mobility have been realized in PMOS devices (i.e., metal-oxide-semiconductor (MOS) devices with n-type, or n-doped, active-device regions and p-type transistor channels), or transistors, by compressively stressing the channels of such devices. Similar improvements in electron mobility have been realized in NMOS devices (i.e., MOS devices with p-type, or p-doped, active-device regions and n-type transistor channels), or transistors, when the channels thereof experience tensile strain.

A number of techniques have been researched to compressively stress PMOS regions, including the inclusion of a strained layer of silicon-germanium (SiGe) within a silicon active-device (e.g., source or drain) region to compressively stress the active-device region, which results in an increase in hole mobility of up to 50%. Strained silicon-germanium layers have also been embedded in the active-device regions of NMOS devices to compressively stress the channels between the active-device regions.

When silicon-germanium is used, a thin layer of silicon-germanium is formed, typically by ultra-high vacuum chemical vapor deposition (CVD) techniques. The layer of silicon-germanium is then capped with a silicon film, which prevents incorporation of germanium into the gate oxide. Lattice mismatches between the silicon-germanium layer and the silicon capping layer generate the desired compressive stress or tensile stress. The silicon-germanium layer may be graded to a relaxed or unstrained state, which generates stress in the silicon capping layer. If both the silicon-germanium layer and the silicon capping layer are thin, they will both be strained. At high gate voltages, the germanium-silicon-silicon capping layer structure has dual-channel characteristics. While many of the carriers or holes are located in the silicon germanium layer, some carriers or holes are also present at the interface between the silicon capping layer and the gate oxide. Unfortunately, the ultra-high vacuum CVD techniques that have been used to fabricate silicon-germanium layers are extremely expensive and, thus, not conducive to use in large-scale semiconductor device fabrication processes.

A number of other experimental techniques for stressing active-device regions of semiconductor device structures have also been developed. Tensile strain has been generated in the channels of NMOS devices by using silicon carbide (SiC) in the active-device regions. Semiconductor device structures have also been bent (which may, e.g., be effected in packaging and encapsulation) to stress the transistor channels. In addition, semiconductor device structures have been fabricated with stress-inducing silicon nitride capping layers.

It would be desirable to develop a process by which transistor channels of semiconductor device structures may be stressed economically and on a scale that is suitable for incorporation into semiconductor device fabrication.

BRIEF DESCRIPTION OF THE SEVERAL VIEWS OF THE DRAWINGS

In the drawings, in which various features of embodiments of the present invention are depicted.

DETAILED DESCRIPTION

Embodiments of the present invention include applying and securing semiconductor material strips to substrates in such a way as to stress the semiconductor material. As used herein the term "strips" means and encompasses segments of semiconductor material regardless of configuration. Strips of semiconductor material on a given substrate may be compressively stressed, subjected to tensile stress, or some strips may be compressively stressed while other strips are tensilely stressed. Stress may be induced by forming non-planarities on the surface of the substrate to which the strips of semiconductor material are to be secured. The non-planarities may be configured to stress strips of semiconductor material as the strips are secured thereover or to stress strips of semiconductor material as the non-planarities are removed from beneath the strips. The internal strain that ultimately results from stressing the strips of semiconductor material improves carrier mobility (i.e., electron mobility, electron hole pair, or "hole," mobility) relative to the carrier mobilities of unstrained semiconductor materials.

The edges of the strained semiconductor material strips may be conductively doped with either p-type, or positive charge carrier or hole-generating, dopants, or impurities (e.g., boron (B), aluminum (Al), etc.), or with n-type, or negative charge carrier or electron-donating, dopants, or impurities (e.g., phosphorus (P), arsenic (As), antimony (Sb), etc.). Such conductively doped regions of semiconductor material may, in some embodiments of the present invention, serve as active-device regions (e.g., source and drain regions) of transistors. The central, or middle, regions of the strained semiconductor material strips may serve as the channels for the transistors, such as metal-oxide semiconductor field-effect transistors (MOSFETs). N-channel MOSFETs and P-channel MOSFETs are used together in complementary metal oxide semiconductor (CMOS) devices.

Reference will now be made to the figures wherein like numerals represent like elements. The figures are not necessarily drawn to scale. Elements in the figures are drawn in cross-section.

FIGS. 1-9 depict, in simplified cross-section, an embodiment of a process for forming compression islands 120a" (FIG. 9) and tension islands 120b" (FIG. 9) on an active surface of a substrate 110. Compression islands 120a" and tension islands 120b" have dimensions and shapes that are configured to uni-axially or bi-axially stress strips of semiconductor material that will subsequently be applied and secured over the active surface of substrate 110. Compression islands 120a" and tension islands 120b" may, by way of nonlimiting example, be configured as elongate structures that have a collective wave-like appearance on portions of the active surface of substrate 110.

Figure 1:
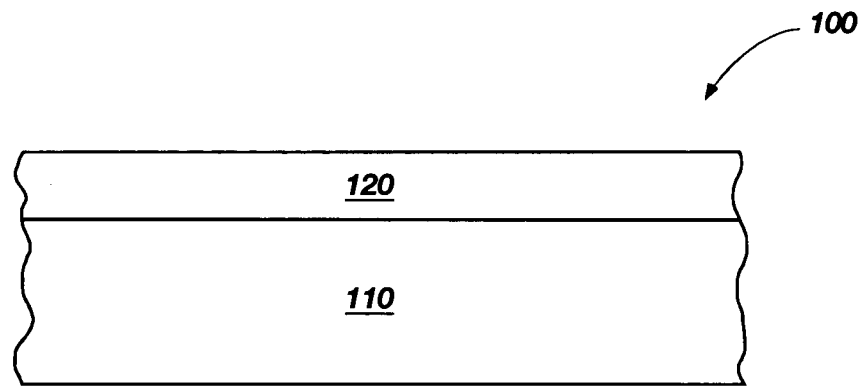
FIGS. 1-9 depict an embodiment of a method according to the present invention for preparing a substrate to induce stress in strips of semiconductor material applied to the substrate.

FIG. 1 illustrates a partially fabricated semiconductor device 100. Partially fabricated semiconductor device 100 includes a substrate 110. In some embodiments of the present invention, substrate 110 may be formed from glass, silicon oxycarbide, or aluminum oxycarbide. A non-planarity introducing layer 120 is formed or placed on substrate 110. Non-planarity introducing layer 120 may include an oxidizable semiconductor material, such as silicon (e.g., epitaxial silicon, amorphous silicon, or polycrystalline silicon). Non-planarity introducing layer 120 and substrate 110 together may form a silicon-on-insulator ("SOI") substrate, such as a silicon-on-glass ("SOG") substrate, a silicon-on-sapphire ("SOS") substrate, a silicon-on-ceramic ("SOC") substrate, silicon on any other suitable insulative material, or another semiconductor material on a compatible and suitable insulative material. In some embodiments, substrate 110 may include an SOG substrate in which the glass is borosilicate glass ("BSG") (e.g., PYREX®), fused silica, fused quartz, silicon oxycarbide, aluminum oxycarbide. U.S. Patent Application Publication 2004/0232487, published Nov. 25, 2004; U.S. Patent Application Publication 2005/0167752, published Aug. 4, 2005; U.S. Patent Application Publication 2005/0020094, published Jan. 27, 2005; and U.S. Pat. No. 7,008,854, issued Mar. 7, 2006; the disclosure of each of which is hereby incorporated herein in their entireties by this reference, disclose different types of glass from which substrate 110 may be formed. Substrate 110 may, commensurate with known semiconductor device fabrication techniques, comprise a wafer or other bulk substrate upon which a large plurality of semiconductor devices 100 are simultaneously fabricated.

In embodiments of the present invention, non-planarity introducing layer 120 will be formed (e.g., deposited, laminated, formed in situ or otherwise formed) by known processes and modified to form oxide islands on the surface of substrate 110. The oxide islands function as non-planarities that are used to apply stress to semiconductor material strips secured thereover or therebetween. In one embodiment, the oxide islands are formed by removing material from select regions of non-planarity introducing layer 120. An oxide is formed over non-planarity introducing layer 120 and then subsequently planarized. Non-planarity introducing layer 120 is then oxidized to form hills and valleys across the surface of substrate 110. Material is then uniformly removed from non-planarity introducing layer 120 until substrate 110 is exposed. Thus, the oxide hills become oxide islands on the surface of substrate 110.

Figure 2:
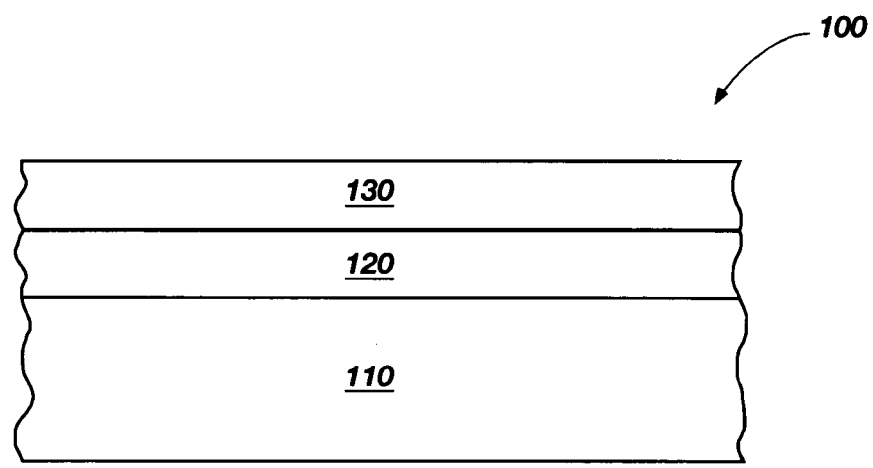
Figure 3:
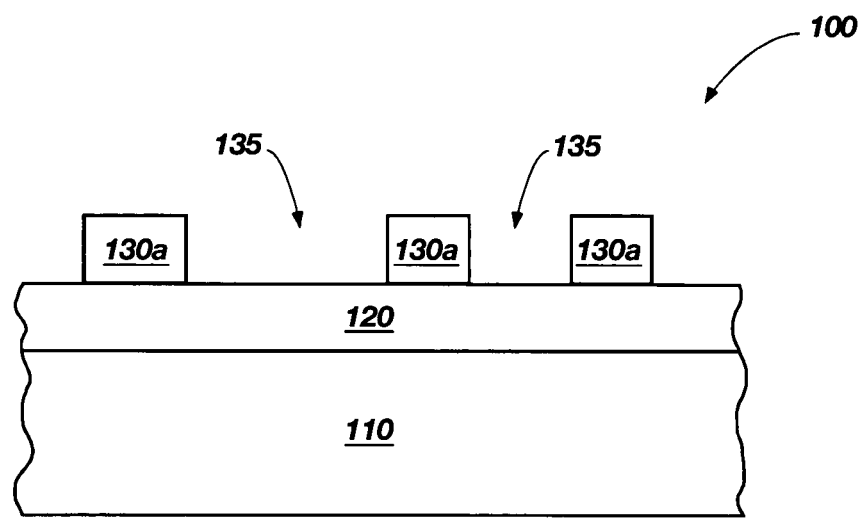

Mask 130 as illustrated in FIG. 2 may be used to govern the removal of material from non-planarity introducing layer 120. Mask 130 may be formed on non-planarity introducing layer 120 and may comprise any suitable resist material known in the art. In some embodiments, mask 130 may include a photoresist, such as a conventional photoresist that is configured to at least partially cross-link when exposed to electromagnetic radiation having a wavelength of 248 nm or 193 nm. Mask 130 may also be formed from a material that at least partially cross-links when exposed to an electron beam or X-rays. In other embodiments, mask 130 may include a carbon-based mask (e.g., transparent carbon, etc.). In still other embodiments, mask 130 may be a hard mask (e.g., formed from silicon nitride, silicon oxynitride, etc.). Mask 130 may include multiple layers of different materials. Mask 130 may be formed by methods known to those of ordinary skill in the art. FIG. 3 illustrates a patterned mask 130 that includes protective regions 130a and apertures or other open areas 135 formed in between protective regions 130a.

Figure 4:
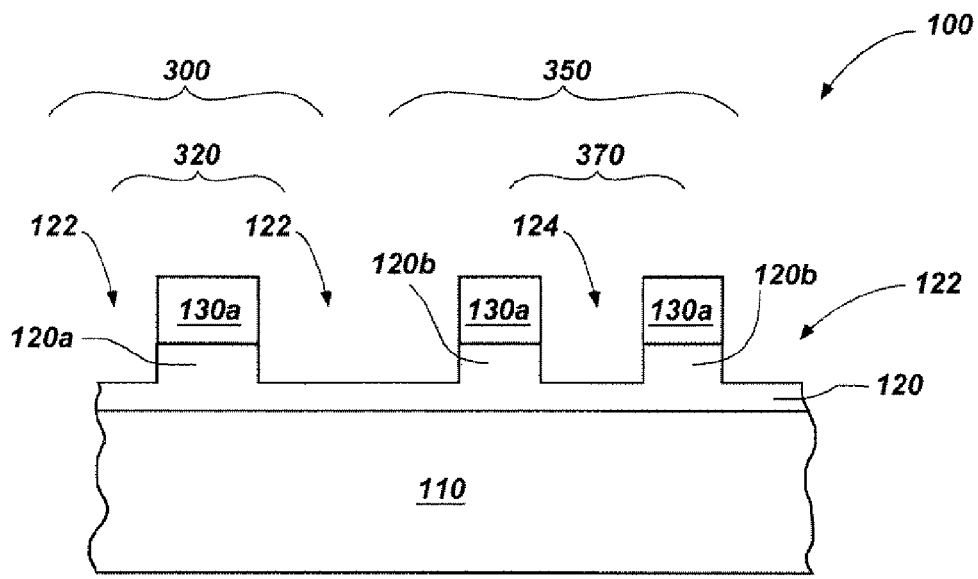

FIG. 4 illustrates non-planarity introducing layer 120 after material has been removed (e.g., with a suitable etchant) from regions exposed through apertures 135 of mask 130. The removal of material from non-planarity introducing layer 120 may be accomplished by an etch process, such as a dry etch selective for the non-planarity introducing layer 120 over the protective regions 130a of mask 130. The removal of such material from non-planarity introducing layer 120 results in the formation of isolation trenches 122 and tension trenches 124 in non-planarity introducing layer 120. Compression hills 120a are located between isolation trenches 122. Tension trenches 124 are located between tension hills 120b. Compression hills 120a and tension hills 120b are formed from regions of non-planarity introducing layer 120 shielded by protective regions 130a of mask 130 during the material removal process. Compression hills 120a and tension hills 120b will be used to form oxide islands on the surface of substrate 110. The depths of isolation trenches 122 and tension trenches 124 may be selected to provide non-planarities of desired dimensions and shapes on the surface of substrate 110 once the trenches 122, 124 are filled with an oxide and non-planarity introducing layer 120 is subsequently oxidized. After oxidation, the heights of compression hills 120a and tension hills 120b are greater than the thicknesses of the regions that were previously filled with oxide.

FIG. 4 also depicts a first transistor region 300 and a second transistor region 350. Transistors will eventually be formed in first transistor regions 300 and second transistor regions 350. Commensurate with conventional semiconductor device fabrication practices, partially fabricated semiconductor device 100 may include numerous transistor regions. As illustrated, isolation trenches 122 may separate first transistor regions 300 and second transistor regions 350. Within first transistor regions 300 are compression regions 320. Compression regions 320 serve to illustrate the regions where compressive strain will eventually be introduced into semiconductor material strips. The top of each compression hill 120a defines the center of each compression region 320. Within second transistor regions 350 are tension regions 370. Tension regions 370 serve to illustrate the regions where tensile strain will eventually be introduced into semiconductor material strips applied to substrate 110. The tops of each pair of tension hills 120b define the boundaries of tension regions 370. The center of each tension trench 124 defines the center of each tension region 370.

Figure 5:
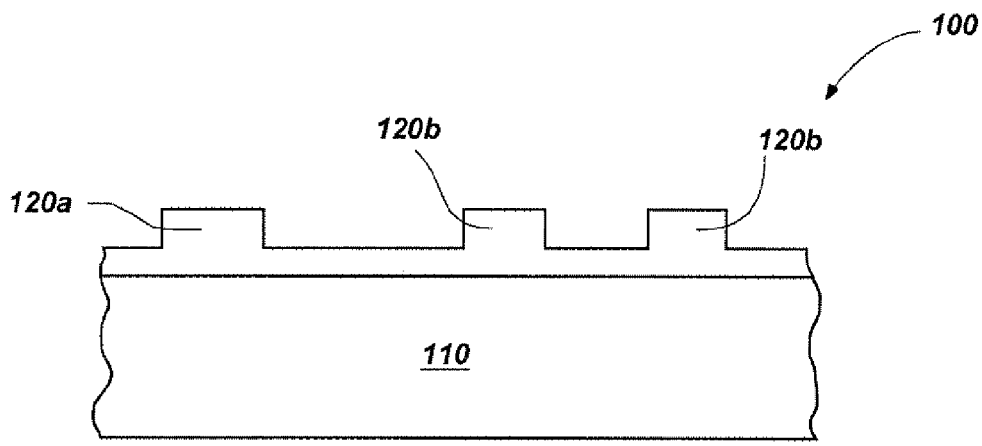

After material is removed from non-planarity introducing layer 120, protective regions 130a of mask 130 may be removed as illustrated in FIG. 5. Protective regions 130a may be removed by any method known in the art, such as with a strip for a photomask or an etch for a hard mask. In embodiments where protective regions 130a include transparent carbon, an etch utilizing nitrogen, oxygen, and bromic acid may be used to remove solid regions 130a.

Figure 6:
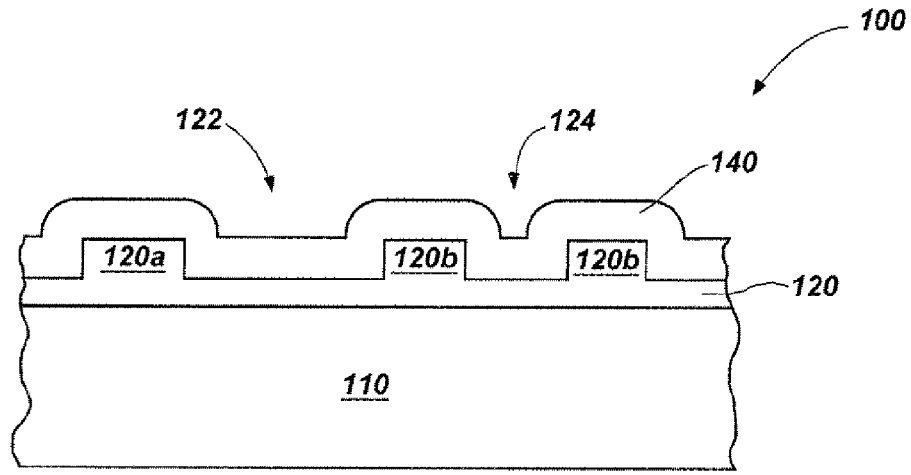

FIG. 6 depicts blanket layer 140 formed over non-planarity introducing layer 120 and filling isolation trenches 122 and tension trenches 124. Blanket layer 140 may be formed before or after solid regions 130a are removed. Blanket layer 140 may be formed by any method known in the art, such as atomic layer deposition (ALD) processes or chemical vapor deposition (CVD) processes.

Blanket layer 140 may comprise the same material as, or a similar material to, the material of an oxide of non-planarity introducing layer 120 to be subsequently formed (i.e., similar to the oxide that will result from the oxidation of non-planarity introducing layer 120). Blanket layer 140 may include an oxide or any other material that is removable (e.g., by etching) at a similar rate and under the same conditions as an oxide of non-planarity introducing layer 120. In embodiments where non-planarity introducing layer 120 includes silicon as the material to be oxidized, blanket layer 140 may include silicon oxides or any other material that is removable at a rate similar to the removal rate of the silicon oxides.

Figure 7:
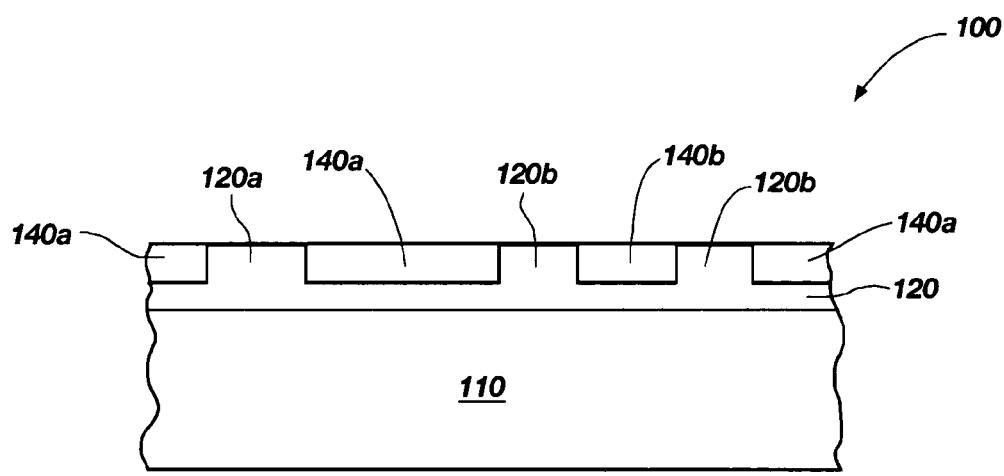

After blanket layer 140 is formed, blanket layer 140 is planarized, as depicted in FIG. 7. Blanket layer 140 may be planarized by any suitable method known in the art. In some embodiments, known abrasive planarization techniques such as chemical-mechanical planarization (CMP) processes may be used. Blanket layer 140 is planarized until the tops of compression hills 120a and tension hills 120b are substantially coplanar with the remaining portions of blanket layer 140 filling isolation trenches 122 and tension trenches 124 (i.e., planarized blanket layer portions 140a and 140b).

Figure 8:
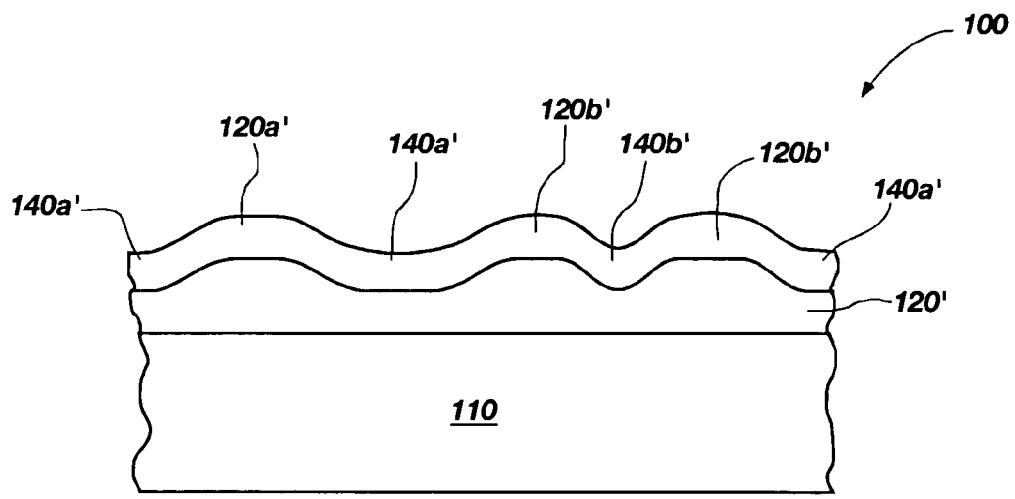

After planarization of blanket layer 140, which exposes compression hills 120a and tension hills 120b, non-planarity introducing layer 120 is oxidized, as illustrated in FIG. 8. The oxidation of non-planarity introducing layer 120 may be accomplished by any suitable method known in the art, such as by thermal oxidation. The oxidation of non-planarity introducing layer 120 results in different oxide thicknesses (i.e., non-planarities) on different regions of the surface of substrate 110. Exposed compression hills 120a and tension hills 120b oxidize more rapidly than regions covered by planarized blanket layer portions 140a and 140b. Oxidized compression hills 120a' and oxidized tension hills 120b' are increased in thickness by the oxidation. Sloped blanket layers 140a' and 140b' are sloped by the formation of slowly tapering oxide wedges, which are referred to as "bird's beaks," which are formed by the lateral diffusion of oxidants under the edges of planarized blanket layer portions 140a and 140b. The bird's beak has a shape similar to that formed during a LOCal Oxidation of Silicon ("LOCOS") process. LOCOS processes and oxidation processes are known in the art, and include without limitation those disclosed in U.S. Patent Application Publication 2004/0173798, published Sep. 9, 2004, and U.S. patent application Ser. No. 11/498,586, filed Aug. 3, 2006, the disclosure of each of which document is hereby incorporated herein in its entirety by this reference.

Figure 9:
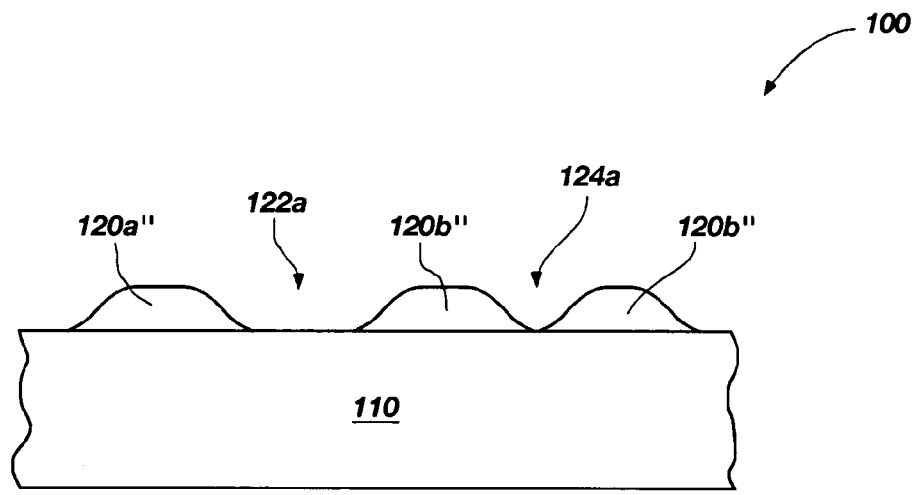

Next, material is removed from oxidized non-planarity introducing layer 120', such as with a known etch process (e.g., an anisotropic etch), to expose the surface of substrate 110. Sloped blanket layers 140a' and 140b' may be substantially entirely removed, as depicted in FIG. 9, to form isolation valleys 122a and tension valleys 124a, respectively. The bird's beaks remain at the edges of oxidized compression hills 120a' and tension hills 120b' which remain on the surface of substrate 110 in the form of compression islands 120a" and tension islands 120b".

Figure 11:
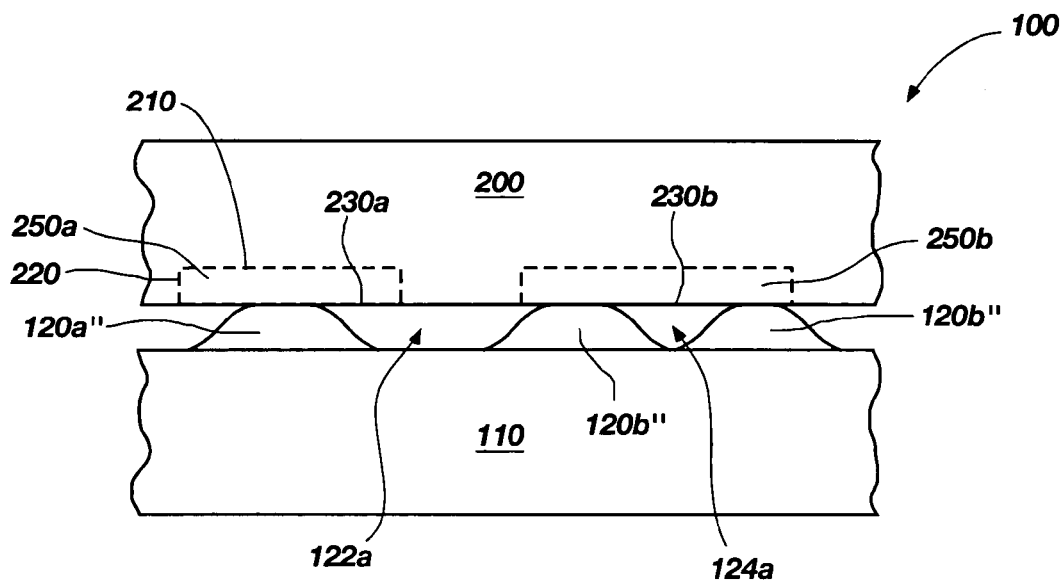
Figure 12:
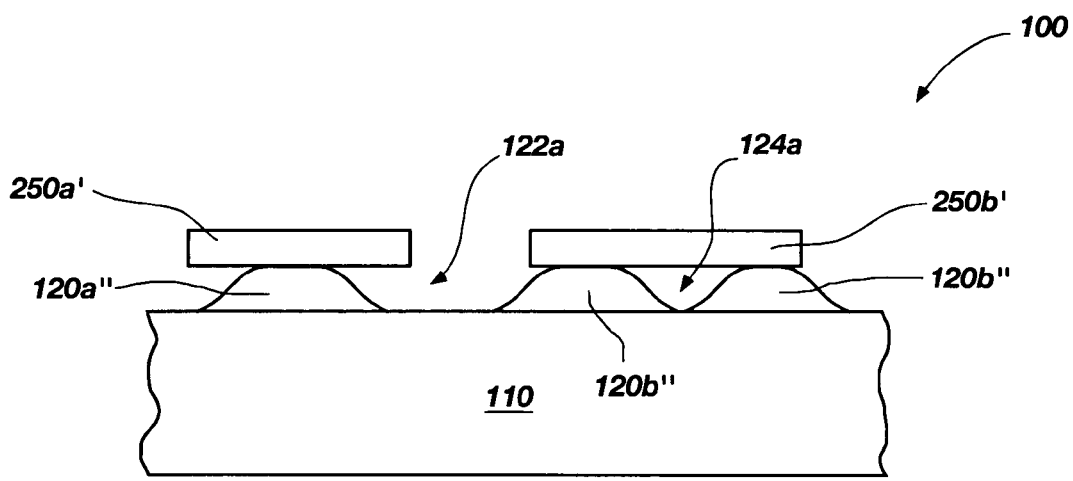
FIGS. 12-14 show an embodiment of the present invention in which strips of semiconductor material are applied to a substrate and stressed.

In some embodiments, the dimensions of compression islands 120a" and tension islands 120b" may be tailored to apply a desired type and/or amount of stress to strips 250a' and 250b' of semiconductor material applied thereover (FIGS. 11-12). The semiconductor material of strips 250a' and 250b' and the results of stressing that semiconductor material may determine how much strain will ultimately occur in the semiconductor material. It may be desirable to stress the semiconductor material strips 250a' and 250b' such that their lengths are compressed or stressed, respectively, by as much as about 0.5% or more. The lengths of the semiconductor material strips 250a', 250b' may be compressed or stretched about 0.75% to about 1.5%. A stress range of about 1% to about 1.2% may be targeted during fabrication to avoid altering the lengths of the semiconductor material strips 250a', 250b' by less than about 0.75% or more than about 1.5%.

The dimensions and shapes of compression islands 120a" and/or tension islands 120b" may, in embodiments of the present invention, be tailored to act in conjunction with the respective crystal orientations of the semiconductor material of strips 250a', 250b' to stress the semiconductor material strips 250a', 250b' in the desired manner and to the desired extent. In this regard, strained semiconductor material strips 250a', 250b' may, in various embodiments, include mono-crystalline semiconductor material. The mono-crystalline semiconductor material may be oriented in a number of different possible planes relative to surfaces of the strip formed from the mono-crystalline semiconductor material. The different "surface orientations," which are referred to herein using conventional Miller indices in parentheses, include (100), (110), and (111) surface orientations. Relative to a given surface orientation, some directions within a crystal structure may exhibit more carrier mobility than others (i.e., some directions are more conductive than others). Different directions are identified herein using angle brackets (e.g., <100>, <110>, etc.).

With reference now to FIGS. 10-14, an embodiment of a method for forming strips of semiconductor material, securing the same in place over the active surface of substrate 110, and inducing stress in the strips of semiconductor material is illustrated.

Figure 10:
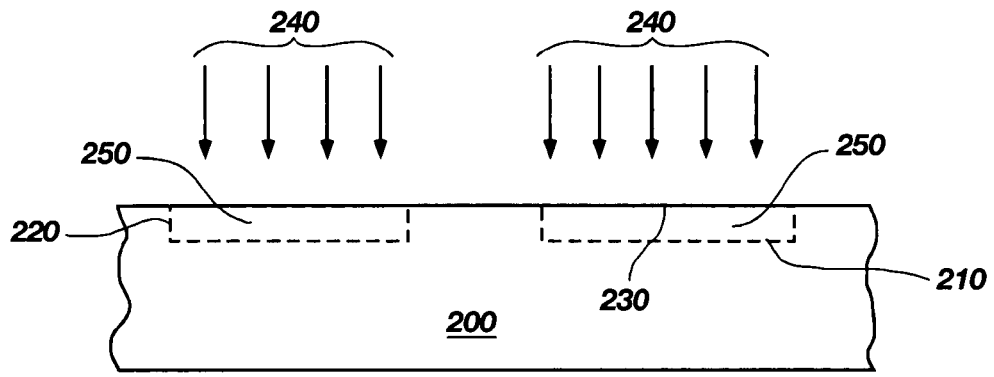
FIGS. 10 and 11 illustrate a method for forming strips of semiconductor material from a sacrificial substrate.

FIG. 10 illustrates a sacrificial substrate 200, such as a semiconductor wafer (e.g., a mono-crystalline silicon wafer or any other material with conductive properties that may be altered when strained). Sacrificial substrate 200 may include silicon, germanium, silicon-germanium, gallium arsenide, indium phosphide, or any other suitable semiconductor material. Sacrificial substrate 200 has a selected crystal orientation (e.g., a (100), (110), or (111) orientation).

Strips 250 are formed in sacrificial substrate 200 so as to enable their mobility directions to be oriented or stressed (and ultimately strained) in a desired manner. Tensile strain in a <110> channel direction (i.e., desired direction of mobility of a silicon surface serving as a channel in a transistor) optimizes electron mobility in a (100) surface orientation semiconductor material, while compressive strain in a <110> channel direction optimizes hole mobility in a (100) surface orientation semiconductor material. Hole mobility may also be optimized in semiconductor material with a (110) surface orientation when tensile strain is present in the <100> direction.

Strips 250 are defined in a surface of sacrificial substrate 200 by known processes, such as the so-called "smart-cut" technology disclosed in U.S. Patent Application Publication 2004/0224480, published Nov. 11, 2004, the entire disclosure of which is hereby incorporated herein by this reference. In embodiments where "smart-cut" technology is utilized, hydrogen species, such as $H^+$, $H_2^+$, $D^+$, or $D_2^+$ ions (where "D" represents deuterium), may be used as implantation species 240. The dimensions (e.g., the width, length, and thickness) of unremoved strips 250 are controlled by the peripheral boundaries of horizontal implantation locations and the implantation depth of implantation species 240 implanted in sacrificial substrate 200.

Implantation species 240 are implanted along back side plane 210 as illustrated in FIG. 10, which will eventually define the back side of unremoved strips 250. The depth of back side plane 210 will determine the thickness of unremoved strips 250. The thicknesses of unremoved strips 250 may be sufficient to generate a desired amount of strain in the semiconductor material of the unremoved strips 250. Unremoved strips 250 may have thicknesses of about 1000 Å or less, of about 300 Å or less, of about 100 Å or less, or of about 50 Å or less.

Implantation species 240 are also implanted along edge planes 220 to define the peripheries (e.g., ends and sides) of unremoved strips 250. The widths of unremoved strips 250 may be narrow relative to the lengths of the strips. Without limiting the scope of the present invention, unremoved strips 250 may have widths of about 300 Å to about 1000 Å.

Contact faces 230 of unremoved strips 250, which are the surfaces of unremoved strips 250 that are exposed on the surface of sacrificial substrate 200 prior to removing strips 250 therefrom, will be the surfaces used to contact the oxide islands 120a", 120b" protruding from the surface of substrate 110, as well as the surface of substrate 110, as shown in FIG. 11. A native oxide (not shown) may or may not be present (i.e., the native oxide may be removed or prevented from forming) on each contact face 230. If a native oxide is present, the native oxide may be formed either before or after implantation with implantation species 240.

After implantation, as depicted in FIG. 11, sacrificial substrate 200 may be oriented relative to a fabrication substrate 110 such that strips 250a and 250b are aligned over corresponding islands 120a", 120b" and such that the crystal orientation of the semiconductor material of strips 250a, 250b is parallel to the desired direction of carrier mobility (i.e., electron mobility or hole mobility). Contact faces 230a of strips 250a may be positioned over, brought into contact with, and secured to the peaks of compression islands 120a". A contact face 230b of each strip 250b is positioned over, brought into contact with, and secured over a tension valley 124a, secured to the peaks of a pair of tension islands 120b" located on either side of tension valley 124a proximate ends thereof defined by edge planes 220. In some embodiments, strips 250a and 250b may be initially secured to the peaks of their respective islands 120a", 120b" by van der Waals forces.

After initially securing unremoved strips 250a and 250b to the peaks of their respective islands 120a", 120b", unremoved strips 250a and 250b are separated from sacrificial substrate 200. Heat and/or mechanical stress (e.g., bending, torsion, etc.) may be utilized to disengage, or break the back sides 210 and edges of strips 250a and 250b free from the remainder of sacrificial substrate 200 and, thus, to remove the strips 250a and 250b from the remainder of sacrificial substrate 200.

Heat may also be used to strengthen the respective bonds between strips 250a and 250b and the peaks of islands 120a" and 120b". In one embodiment, the bond is strengthened at a temperature between about 300° C. and 400° C. The same heating process used to separate unremoved strips 250a and 250b from sacrificial substrate 200 may be used to strengthen the respective bonds between the unremoved strips 250a and 250b and the respective peaks of islands 120a" and 120b".

FIG. 11 illustrates the simultaneous removal of strips 250a and 250b from a sacrificial substrate 200, as well as their simultaneous application to a fabrication substrate 110, which is useful when strips 250a" and 250b" (FIGS. 13 and 14) having the same crystal orientations with strain in parallel carrier mobility directions are desired. In one embodiment, semiconductor material strips 250a and 250b with a (100) surface orientation may be oriented over substrate 110 so as to be subsequently strained (strips 250a will ultimately be compressively strained, while strips 250b will ultimately be tensilely strained) in the <110> direction. In another embodiment, semiconductor material strips 250a and 250b with a (111) surface orientation may be oriented over substrate 110 so as to be subsequently respectively, compressively and tensilely strained in the <110> direction.

However, in embodiments where strips 250a, 250b with different crystal orientations or strips 250a, 250b having different carrier mobility directions are to be applied to a single substrate, a first set of strips 250a, 250b may be provided by a sacrificial substrate 200 and secured to substrate 110 separately from a second set of strips 250a, 250b, which are separately provided from the same sacrificial substrate 200 or a different sacrificial substrate 200. In such embodiments, strips 250a and 250b may be secured to their respective islands 120a" and 120b" of a fabrication substrate 110 in separate process acts. In one such embodiment, strips 250a may have a (100) surface orientation and be oriented so as to subsequently be compressively strained in the <110> direction, while strips 250b may have a (110) surface orientation and be oriented so as to subsequently be tensilely strained in the <100> direction.

After removal from sacrificial substrate 200, semiconductor material strips 250a' and 250b' are further secured to the peaks of the islands 120a", 120b", as depicted in FIG. 12. In some embodiments and as previously mentioned, van der Waals forces are sufficient to influence the conformation of semiconductor material strips 250a' and 250b' to substrate 110 and the previously uncontacted portions of each of the islands 120a", 120b". In such embodiments, upon their separation from sacrificial substrate 200, semiconductor material strips 250a' and 250b' automatically conform to the topography of substrate 110, islands 120a" and 120b" and tension valleys 124a, as depicted in FIG. 13.

Figure 13:
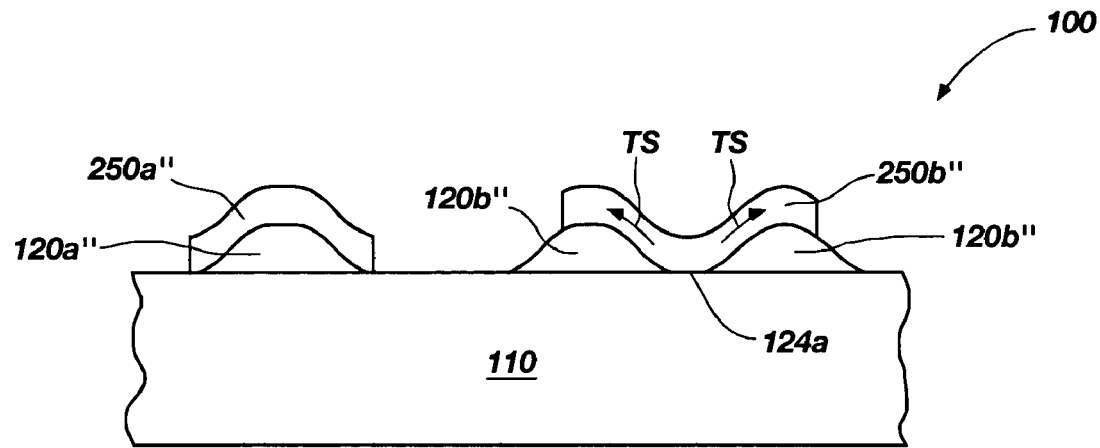

In other embodiments, one or both of the semiconductor material strips 250a' and 250b' do not automatically conform to the shapes of their corresponding islands 120a" and 120b" and into tension valleys 124a, such as is depicted in FIG. 13. In such embodiments, known techniques, such as nano-scale imprint mask technology, may be used to influence the conformance of the semiconductor material strips 250a' and/or 250b'. A nano-scale imprint mask (not shown), which acts as a press, can be made with very small raised areas that are located and configured to force elevated regions of the semiconductor material strips 250a', 250b' into the tension valleys 124a or recesses over which they are elevated. Other techniques employing heat and pressure may also be used to influence conformance of semiconductor material strips 250a' and 250b' to the shapes of their corresponding islands 120a", 120b" and, where desired, intervening valleys such as tension valleys 124a. In one embodiment, semiconductor material strips 250a' and 250b' may be separated from sacrificial substrate 200 in a vacuum and then atmospheric pressure may be applied to influence conformance of semiconductor material strips 250a' and 250b'.

Notably, the conformance of semiconductor material strips 250a", as depicted in FIG. 13, may apply little or no stress to the semiconductor material strips 250a", as the ends of the semiconductor material strips 250a" may be free to move during conformance.

The conformance of semiconductor material strips 250b" may introduce tensile stress TS into the semiconductor material strips 250b", as depicted in FIG. 13. The ends of each of the semiconductor material strips 250b" respectively secured to peaks of a pair of tension islands 120b" and so remain stationary as the center of each semiconductor material strip 250b" is drawn or forced into conformance with remaining portions of the pair of tension islands 120b" and tension valley 124a therebetween. Van der Waals forces initially secure semiconductor material strips 250a" and 250b" to the islands 120a", 120b" and to adjacent regions of the exposed surface of substrate 110. The semiconductor material strips 250a", 250b" may be further secured to their respective islands 120a", 120b" and/or substrate 110 with heat (e.g., a temperature of about 300° C. to about 400° C.). As a resulting internal tensile strain will ultimately be present in the semiconductor material of strips 250b" of this embodiment, they are also referred to herein as "strained semiconductor material strips 250b"," or more simply as "strips 250b"."

Figure 14:
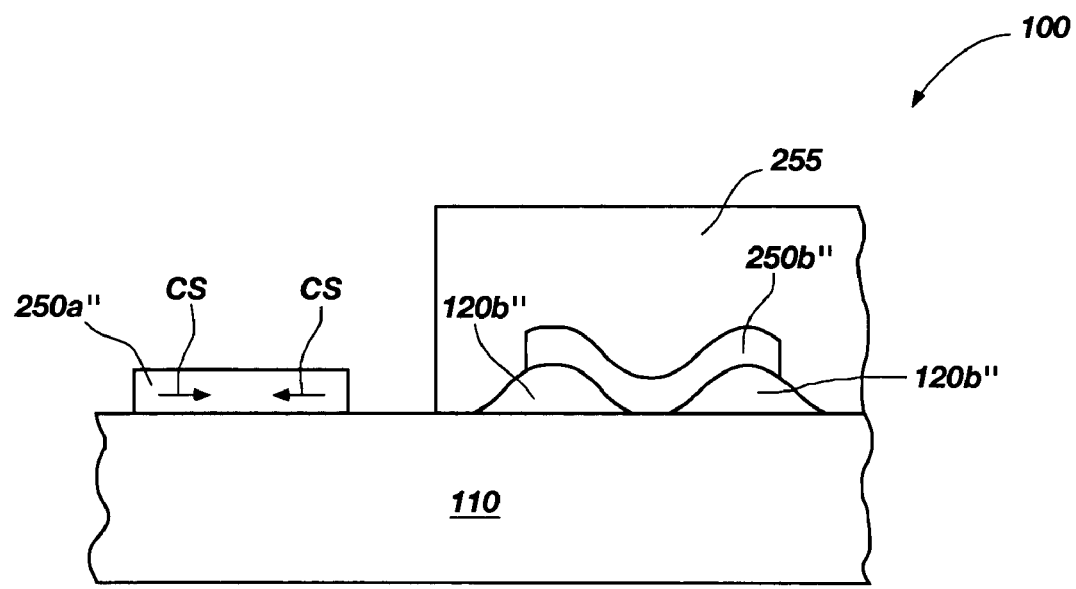

With reference now to FIG. 14, in embodiments where strips 250a' and 250b" (FIGS. 12 and 13) have been secured in place over substrate 110, strips 250b" may be masked (e.g., with a mask 255 of any suitable type, as shown) to prevent removal of their corresponding tension islands 120b". Compression islands 120a", which underlie strips 250a' and are exposed through apertures or other open areas in mask 255, may be removed. Undercutting etch processes, such as isotropic wet or dry etches, may be used to remove compression islands 120a" from beneath strips 250a'. The etchant that is employed may remove the material of the compression islands 120a" with selectivity over the semiconductor material of strips 250a' and the material or materials of substrate 110. In a specific embodiment where strips 250a' include silicon and compression islands 120a" include silicon dioxide, a wet etchant including hydrofluoric acid may be used. In another specific embodiment where strips 250a' include silicon and compression islands 120a" include silicon dioxide, a plasma etch including species derived from $CH_4$, $O_2$, and $H_2$ may be used to remove silicon dioxide with selectivity over silicon.

After compression islands 120a" are removed, semiconductor material strips 250a', 250a" (FIGS. 12 and 13) conform to substrate 110 as illustrated in FIG. 14. As compression islands 120a" are removed, the fixed edge portions of strips 250a" remain stationary as the center of each strip 250a" is drawn (e.g., by van der Waals forces) and/or forced into contact with the active surface of substrate 110 by previously mentioned techniques, which introduces compressive stress CS in strips 250a". As a result, internal compressive strain will ultimately be present in the semiconductor material of strips 250a" of this embodiment, they are also referred to herein as "strained semiconductor material strips 250a"," or more simply as "strips 250a"."

Exposed surfaces of strips 250a', 250a", 250b" may, in some embodiments, be polished to reduce the thickness thereof. Polishing may be accomplished by any method known in the art, such as by chemical polishing and CMP processes.

Strained semiconductor material strips 250a" and 250b" may be further bonded to substrate 110. Heat may be used to strengthen the bond between the strained semiconductor material strips 250a" and 250b" and substrate 110. In one embodiment, the bond is strengthened at a temperature between about 800° C. and about 1000° C. In some embodiments, after strained semiconductor material strips 250a" and 250b" are further bonded to substrate 110, grinding, polishing, chemical etch, or plasma etch may be used to further thin strained semiconductor material strips.

FIGS. 1-14 illustrate embodiments for forming, placing, and applying stress to semiconductor material strips 250a' and 250b' to form strained semiconductor material strips 250a" and 250b" on substrate 110. FIG. 14 illustrates a compressively strained semiconductor material strip 250a" adjacent a tensilely strained semiconductor material strip 250b". Alternatively, embodiments of the process depicted in FIGS. 1-14 may be modified by suitable placement of oxide islands 120a", 120b" to form strained semiconductor material strips 250a" adjacent other strained semiconductor material strips 250a" and/or strained semiconductor material strips 250b" formed adjacent other strained semiconductor material strips 250b".

Figure 15:
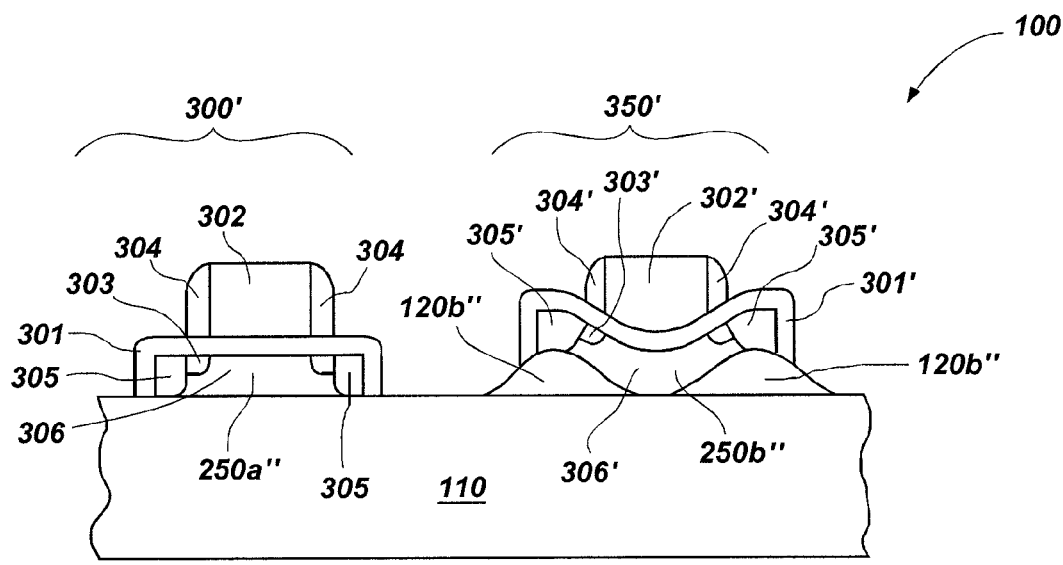
FIG. 15 illustrates an embodiment of a semiconductor device structure that includes at least two transistor gates that incorporate strips of strained semiconductor material.

Semiconductor device structures incorporating strained semiconductor materials strips 250a" and 250b" are illustrated in FIG. 15. In particular embodiments, transistors, such as MOSFETs, may be formed using the strips. Each transistor may include, among numerous other contemplated elements, a source, a drain, a channel, a gate dielectric, a gate, and sidewall spacers, as described in further detail hereinafter. A strained semiconductor material strip 250a", 250b" may serve as the source, drain, and channel for each transistor.

FIG. 15 depicts a semiconductor device structure 100 according to embodiments of the present invention that includes a first transistor 300' and a second transistor 350' that include strained semiconductor material strips 250a" and 250b", respectively. The transistor components illustrated may be modified, deleted, or added to as desired. Gate dielectrics 301, 301' are depicted as formed on the top and sides of strained semiconductor materials strips 250a" and 250b". Gate dielectrics 301, 301' may serve to isolate transistors formed in first transistor regions 300' from transistors formed in second transistor regions 350'. Gates 302, 302' may be formed on gate dielectrics 301, 301'. Lightly doped regions 303, 303' may be shallowly formed in the ends of strained semiconductor material strips 250a" and 250b". Sidewall spacers 304, 304' may be formed on gate dielectrics 301, 301' and adjacent gates 302, 302'. Active device regions 305, 305' may also be formed, as known in the art. Active device regions 305, 305' and lightly doped regions 303, 303' which will serve as the source and drain for each of the transistors, may be formed by known dopant implantation processes or otherwise, as known in the art. Active device regions 305, 305' and lightly doped regions 303, 303' may be doped with an n-type dopant, or impurity, to form n-type regions, or with a p-type dopant, or impurity, to form p-type regions. Sidewall spacers 304, 304' may serve to minimize the amount of active device regions 305, 305' that extend beneath gates 302, 302' and thereby reduce parasitic capacitance. The central, or middle region of each of the strained semiconductor material strips 250a" and 250b", which is strained, may serve as the channel 306, 306' for its corresponding transistor 300', 350'. Methods of forming gate dielectrics 301, 301', gates 302, 302' and sidewall spacers 304, 304' are well known in the art. Thus, transistors 300', 350' may be formed each having a source, drain, and channel with improved mobility.

The numerous possible detailed processing acts of forming transistors are known in the art and have not been discussed herein. Specifically, methods of forming transistors, such as P-channel MOSFETs, N-channel MOSFETs, and CMOS devices, are known in the art and may be used with strained semiconductor materials strips 250a" and 250b". U.S. Pat. No. 6,255,698, issued Jul. 3, 2001, the disclosure of which is hereby incorporated herein in its entirety by this reference, discloses embodiments of CMOS fabrication processes that may be used to fabricate transistors 300', 350' of a semiconductor device structure.

FIG. 15 depicts only one embodiment of a semiconductor device structure 100 and transistors 300', 350' thereof that may be formed using strained semiconductor material strips 250a" and 250b". First transistors 300' may include strained P-channel MOSFETs having improved hole mobility due to compressive strain therein. Second transistors 350' may include strained N-channel MOSFETs with improved electron mobility or strained P-channel MOSFETs with improved hole mobility, each due to tensile strain therein.

FIG. 15 depicts a first transistor 300' adjacent to a second transistor 350'. Such an arrangement may be useful when fabricating P-channel MOSFETs adjacent to N-channel MOSFETs, such as in a CMOS design. In other embodiments, first transistors 300' may be formed adjacent other first transistors 300'.This may be desirable when fabricating primarily P-channel MOSFETs. In still other embodiments, second transistors 350' may be formed adjacent to other second transistors 350'. This may be desirable when fabricating primarily N-channel MOSFETs.

In other embodiments, transistors 350' may be formed to adjacent other transistors 350', with some of the transistors 350' comprising P-channel MOSFETs with strips 250b" being strained in a first direction and others of the transistors 350 being N-channel MOSFETs that include strips 250b" that are strained in a second direction. More specifically, one set of transistors 350' may include strips 250b" having a (100) or (111) surface orientation that are under tensile strain in the <110> direction, while another set of transistors 350' include strips 250b" with a (110) surface orientation under tensile strain in the <100> direction.

Embodiments of the present invention also include systems including devices comprising structures formed with strained semiconductor material. The memory system 400 depicted in FIG. 16 and imaging system 500 depicted in FIG. 17 are two embodiments of such systems.

Figure 16:
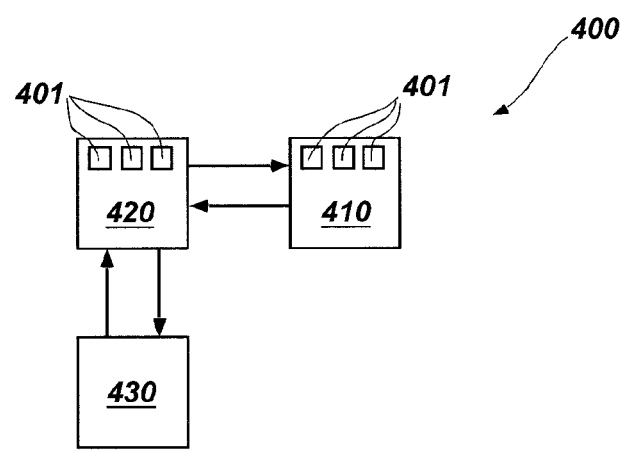
FIG. 16 is a schematic representation of a memory system, according to another embodiment of the present invention, that includes at least one of the types of transistor gates shown in FIG. 15.

A memory system 400 may include a memory 410 in communication with a processor 420 as depicted in FIG. 16. Memory system 400 may also include input/output devices 430 in communication with processor 420. Both memory 410 and processor 420 may include numerous transistors 401 according to embodiments of the present invention. Transistors 401 include strained semiconductor material strips 250a" and/or 250b" according to embodiments of the present invention. Additionally, input/output devices 430 may also include transistors 401 with strained semiconductor material strips 250a" and/or 250b". Memory system 400 may include additional components not depicted, as is known in the art. Memory system 400 may be part of a larger system. Embodiments of such larger systems include, without limitation: computer systems, information handling systems, telecommunications systems, camera systems, video recording and playing systems, television systems, computer display systems, game systems, phone systems, wireless systems, automobile systems, aircraft systems, industrial control systems, and others.

Memory 410 may include one or more types of memory circuits, and various combinations thereof. Possible embodiments of memory 410 in which embodiments of strained semiconductor material strips 250a", 250b" of the present invention may be used include, but are not limited to, Dynamic Random Access Memory ("DRAM"), Static Random Access Memory ("SRAM"), PseudoStatic Random Access Memory, ("PSRAM"), and Flash Memories. DRAM includes, without limitation, synchronous DRAM (SDRAM), SDRAM II, Double Data Rate DRAM ("DDR DRAM"), DDR2 DRAM, and DDR3 DRAM. Flash Memory includes, but is not limited to, NAND (i.e., boolean "Not AND") Flash and NOR (i.e., boolean "Not OR") Flash. Processor 420 may be any processor known in the art. Input/output devices 430 may be any input/output devices known in the art.

Figure 17:
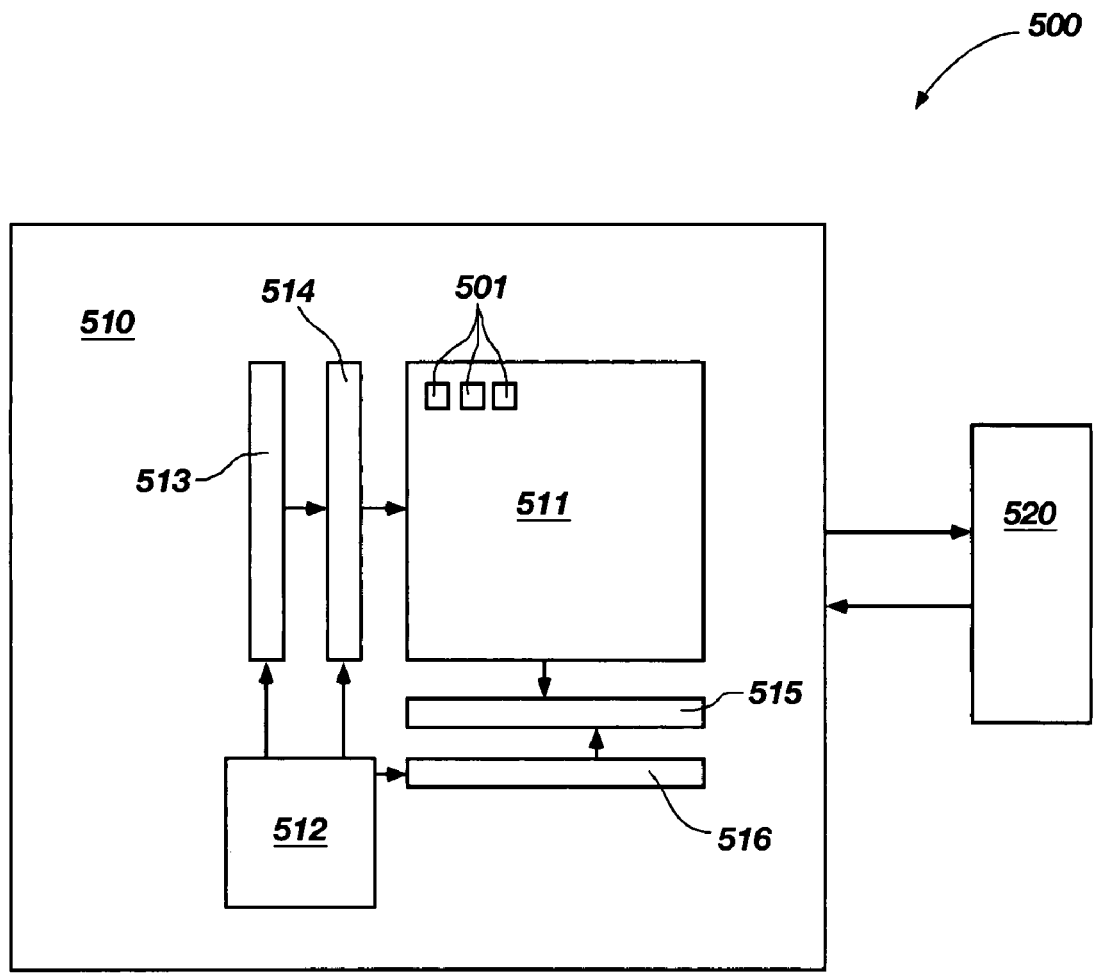
FIG. 17 is a schematic representation of an imaging system, according to yet another embodiment of the present invention that includes at least one of the types of transistor gates shown in FIG. 15.

FIG. 17 illustrates an imaging system 500 according to an embodiment of the present invention. Imaging system 500 includes a CMOS imager 510 and processor 520. CMOS imager 510 includes a pixel array 511, timing and control circuitry 512, a row address decoder 513, a row driver 514, a column driver 515, and a column address decoder 516. Each pixel of pixel array 511 may include transistors 501. Transistors 501 include strained semiconductor material strips 250a" and/or 250b" according to embodiments of the present invention. The pixels of pixel array 511 are arranged in rows and columns. Rows are activated by row driver 514 in response to row address decoder 513. Columns are activated by column driver 515 in response to column address decoder 516. Timing and control circuitry 512 control row address decoder 513 and column address decoder 516. CMOS imager 510 may include other components as is known in the art. Processor 520 communicates with CMOS imager 510, as known in the art.

Imaging system 500 may be part of larger system, such as a computer system, camera system, scanner system, machine vision system, vehicle navigation system, video phone system, surveillance system, auto focus system, star tracker system, motion detection system, image stabilization system, data compression system, such as for high-definition television, and others. Additionally, memory system 400 and imaging system 500 may be subcomponents of a common, larger system.

The foregoing embodiments should not be considered to limit the scope of semiconductor device structures in which strained semiconductor material strips 250a", 250b" according to embodiments of the present invention may be used.

Although this invention has been described with reference to particular embodiments, the invention is not limited to these described embodiments. Rather, the invention is limited only by the appended claims, which include within their scope all equivalent methods, processes, devices, and systems that operate according to the principles of the invention as described.

What is claimed:

1. A semiconductor device structure, comprising:
   a substrate having a surface;
   at least one raised element extending across at least a portion of the surface of the substrate, the at least one raised element including a peak and sloped sides on opposite sides of the peak, the sloped sides tapering from the peak to the surface of the substrate; and
   a strip comprising a semiconductor material located on, secured to, and conforming to a surface, including at least a portion of the peak and at least a portion of at least one sloped side, of at least a portion of the at least one raised element.

2. The semiconductor device structure of claim 1, wherein the at least one raised element comprises a plurality of raised elements.

3. The semiconductor device structure of claim 2, wherein the strip includes:
   a central portion located in a valley between an adjacent pair of raised elements; and end portions located against sloped sides of the adjacent pair of raised elements.

4. The semiconductor device structure of claim 3, wherein the semiconductor material of the strip is under tensile strain.

5. The semiconductor device structure of claim 3, wherein the strip comprises semiconductor material having a (100) or a (111) surface orientation under tensile strain in a <110> direction.

6. The semiconductor device structure of claim 3, wherein the strip comprises semiconductor material having a (110) surface orientation under tensile strain in a <100> direction.

7. The semiconductor device structure of claim 1, wherein the substrate comprises glass, silicon oxycarbide, or aluminum oxycarbide.

8. A semiconductor device structure, comprising:
   a substrate having a surface; and
   a strip comprising a semiconductor material, extending over the surface of the substrate, and including lateral edges, portions of a surface of the strip ending at the lateral edges being secured to the surface of the substrate.

9. The semiconductor device structure of claim 8, wherein at least a central portion of the semiconductor material of the strip is under compressive strain.

10. The semiconductor device structure of claim 9, wherein the strip comprises semiconductor material having a (100) or a (111) surface orientation under compressive strain in a <110> direction.

11. The semiconductor device structure of claim 8, further comprising:
   another strip comprising semiconductor material having a (100) or a (111) surface orientation under tensile strain in a <110> direction.

12. The semiconductor device structure of claim 8, wherein at least a central portion of the semiconductor material of the strip is under tensile strain.

13. The semiconductor device structure of claim 12, wherein the strip comprises semiconductor material having a (100) or a (111) surface orientation under tensile strain in a <110> direction.

14. The semiconductor device structure of claim 13, further comprising:
   another strip comprising semiconductor material having a (110) surface orientation under tensile strain in a <100> direction.

15. The semiconductor device structure of claim 12, wherein the strip comprises semiconductor material having a (110) surface orientation under tensile strain in a <100> direction.

16. The semiconductor device structure of claim 8, wherein the substrate comprises glass, silicon oxycarbide, or aluminum oxycarbide.

17. A complementary metal-oxide-semiconductor (CMOS) device, comprising:
   a substrate;
   a plurality of raised elements on a surface of the substrate, each raised element including sloped sides and a peak; and
   at least one NMOS transistor, including:
      a strip comprising semiconductor material, the strip including:
         active-device regions at side edges thereof, at least portions of the active device regions overlying adjacent sloped sides of a pair of raised elements of the plurality; and
         a transistor channel between the active-device regions and located in a valley between the pair of raised elements of the plurality, tensile strain being present in at least the transistor channel; and
   at least one PMOS transistor, including:
      a strip comprising semiconductor material, the strip including:
         active-device regions at side edges thereof; and
         a transistor channel between the active-device regions.

18. The CMOS device of claim 17, wherein compressive strain is present in at least the transistor channel of the strip of the at least one PMOS transistor.

19. The CMOS device of claim 18, wherein the strip of the at least one PMOS transistor is substantially planar.

20. The CMOS device of claim 18, wherein:
   in the strip of the at least one NMOS transistor:
      the semiconductor material has a (100) or a (111) surface orientation; and
      the tensile strain is present in a <110> direction of the semiconductor material of at least the transistor channel; and
   in the strip of the at least one PMOS transistor:
      the semiconductor material has a (100) or a (111) surface orientation; and
      the compressive strain is present in a <110> direction of the semiconductor material of at least the transistor channel.

21. The CMOS device of claim 17, wherein tensile strain is present in at least the transistor channel of the strip of the at least one PMOS transistor.

22. The CMOS device of claim 21, wherein the strip of the PMOS transistor is located over another pair of raised elements of the plurality with at least a portion of the transistor channel being located in a valley between the another pair of raised elements of the plurality and the active-device regions at least partially overlying adjacent sloped sides of the another pair of raised elements of the plurality.

23. The CMOS device of claim 22, wherein:
   in the strip of the at least one NMOS transistor:
      the semiconductor material has a (100) or a (111) surface orientation; and
      the tensile strain is present in a <110> direction of the semiconductor material of at least the transistor channel; and
   in the strip of the at least one PMOS transistor:
      the semiconductor material has a (110) surface orientation; and
      the tensile strain is present in a <100> direction of the semiconductor material of at least the transistor channel.

24. A complementary metal-oxide-semiconductor (CMOS) device, comprising:
   a substrate;
   at least one NMOS transistor, including:
      a strip comprising semiconductor material protruding from a surface of the substrate, the strip including:
         active-device regions at side edges thereof; and
         a transistor channel between the active-device regions having strain present therein to enhance a mobility of electrons in at least the transistor channel; and
   at least one PMOS transistor, including:
      a strip comprising semiconductor material protruding from the surface of the substrate, the strip including:
         active-device regions at side edges thereof; and
         a transistor channel between the active-device regions having strain present therein to enhance a mobility of electron hole pairs in at least the transistor channel.

25. An electronic system, comprising:
at least one semiconductor device, including:
  a substrate;
  at least one NMOS transistor, including:
    a strip comprising semiconductor material protruding from a surface of the substrate, the strip including:
      active-device regions at side edges thereof; and
      a transistor channel between the active-device regions having strain present therein to enhance a mobility of electrons in at least the transistor channel; and
  at least one PMOS transistor, including:
    a strip comprising semiconductor material protruding from the surface of the substrate, the strip including:
      active-device regions at side edges thereof; and
      a transistor channel between the active-device regions having strain present therein to enhance a mobility of electron hole pairs in at least the transistor channel.

26. The electronic system of claim 25, wherein the at least one semiconductor device comprises a memory device.

27. The electronic system of claim 25, wherein the at least one semiconductor device comprises an imaging device.

28. A semiconductor device structure, comprising:
a substrate having a surface;
at least one raised element extending across at least a portion of the surface of the substrate and including a surface that imparts nonplanarity to the surface of the substrate; and
a strip comprising a semiconductor material located on and secured to at least a portion of the at least one raised element, and conforming to nonplanarity of at least a portion of the surface of the substrate.

29. The semiconductor device structure of claim 28, wherein the at least one raised element comprises a plurality of raised elements.

30. The semiconductor device structure of claim 29, wherein the strip includes:
a central portion located in a valley between an adjacent pair of raised elements; and
end portions located against sloped sides of the adjacent pair of raised elements.

31. The semiconductor device structure of claim 30, wherein the semiconductor material of the strip is under tensile strain.

32. The semiconductor device structure of claim 30, wherein the strip comprises semiconductor material having a (100) or (111) surface orientation under tensile strain in a <110> direction.

33. The semiconductor device structure of claim 30, wherein the strip comprises semiconductor material having a (110) surface orientation under tensile strain in a <100> direction.

34. The semiconductor device structure of claim 28, wherein the substrate comprises glass, silicon oxycarbide, or aluminum oxycarbide.

* * * * *